(12) United States Patent
Holzmann et al.

(10) Patent No.: US 10,816,572 B2
(45) Date of Patent: Oct. 27, 2020

(54) RADIO FREQUENCY MEASURING DEVICE MODULE AND RADIO FREQUENCY MEASURING DEVICE

(71) Applicant: Rohde & Schwarz GmbH & Co. KG, Munich (DE)

(72) Inventors: Gottfried Holzmann, Zorneding (DE); Martin Oetjen, Groebenzell (DE); Klaus Neugebauer, Markt Schwaben (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 338 days.

(21) Appl. No.: 15/870,712

(22) Filed: Jan. 12, 2018

(65) Prior Publication Data

US 2019/0219612 A1    Jul. 18, 2019

(51) Int. Cl.
*G01R 31/26* (2020.01)
*G01R 1/04* (2006.01)
*G01R 31/28* (2006.01)

(52) U.S. Cl.
CPC ........... *G01R 1/04* (2013.01); *G01R 31/2822* (2013.01)

(58) Field of Classification Search
CPC ............ G01R 31/2822; G01R 31/2865; G01R 31/2868; G01R 31/2893; G01R 31/3025; G01R 31/31718; G01R 31/31716; G01R 31/31905; G01R 1/04; G01R 1/0433
See application file for complete search history.

(56) References Cited

U.S. PATENT DOCUMENTS

| | | | |
|---|---|---|---|
| 4,986,778 A | 1/1991 | Liken et al. | |
| 5,251,150 A | 10/1993 | Ladner et al. | |
| 6,211,646 B1 * | 4/2001 | Kouzu | H01M 2/1072 320/107 |
| 2006/0258293 A1 | 11/2006 | Steffen et al. | |
| 2008/0042667 A1 * | 2/2008 | Yamashita | G01R 31/31905 324/750.03 |
| 2010/0210236 A1 * | 8/2010 | Khemakhem | H04W 88/08 455/347 |
| 2016/0204881 A1 * | 7/2016 | Chung | H04B 17/00 455/67.14 |
| 2017/0365888 A1 * | 12/2017 | Kwon | H01M 10/6557 |
| 2018/0045745 A1 * | 2/2018 | Holmes | G01N 35/1065 |

FOREIGN PATENT DOCUMENTS

KR    101177362    *  8/2012
WO    2005/001491 A1    1/2005

* cited by examiner

*Primary Examiner* — Thang X Le

(74) *Attorney, Agent, or Firm* — Christensen O'Connor Johnson Kindness PLLC

(57) ABSTRACT

A radio frequency measuring device module having a first sub-module, a second sub-module, and a third sub-module. The radio frequency measuring device module has a modular structure. The sub-modules are interchangeably mounted on each other. Further, a radio frequency measuring device is described.

17 Claims, 3 Drawing Sheets

RADIO FREQUENCY MEASURING DEVICE MODULE AND RADIO FREQUENCY MEASURING DEVICE

TECHNICAL FIELD

Embodiments of the present disclosure relate to a radio frequency measuring device module as well as a radio frequency measuring device.

BACKGROUND

Radio frequency measuring devices typically comprise several electric circuit boards that are used to receive, process and/or analyze radio frequency signals, for instance the radio frequency signals of a device under test. Usually, a radio frequency measuring device comprises several different units with different functional purposes relating to different technologies for analyzing the radio frequency signals.

In general, the technologies used by radio frequency devices develop fast, but non-uniformly. Therefore, customers need to update their complete hardware regularly, namely the whole radio frequency measuring device, even though certain technologies used by the device are still up-to-date. However, the customer has to replace the whole radio frequency measuring device after a certain time as the several different units are integrated in the device.

To address this problem, radio frequency measuring devices are known that comprise a housing with several slots for accommodating different radio frequency measuring device modules which can be exchanged separately. The housing of the radio frequency measuring device comprises at least one integrated power supply unit used to power the several radio frequency measuring device modules inserted. Due to the modular arrangement of the device, the device can be adapted to the customer's needs.

The different functional units corresponding to a certain functionality are assigned to one radio frequency measuring device module wherein the several radio frequency measuring device modules can be exchanged.

However, the radio frequency measuring device modules themselves are established by different functional units that may become out of date at a certain time or which might become defective. Then, the customer has to exchange the whole radio frequency measuring device module.

SUMMARY

Accordingly, there is a need for a radio frequency measuring device that ensures a high replaceability of its components in a cost-efficient manner.

Embodiments of the present disclosure relate to a radio frequency measuring device modules having:
a first sub-module,
a second sub-module, and
a third sub-module,
wherein the radio frequency measuring device module has a modular structure, the sub-modules being interchangeably mounted on each other.

The radio frequency measuring device module according to the present disclosure ensures a high replaceability of the radio frequency measuring device as the respective module comprises several sub-modules that are mounted on each other in an interchangeable manner. Hence, the radio frequency measuring device module itself has a modular structure. The sub-modules can be exchanged in a simple manner if the respective hardware of one of the sub-modules is outdated or became defective.

Generally, the exchange of one of the sub-modules does not affect the other sub-modules or the radio frequency measuring device module itself due to the interchangeability.

As discussed, a radio frequency measuring device already comprises several radio frequency measuring device modules in a modular manner. However, each of the radio frequency measuring device modules have several functional units that are now provided by different sub-modules which can be exchanged easily. Accordingly, the radio frequency measuring device module has its own modular structure ensuring a higher replaceability of the functional units or rather the functional components of the radio frequency measuring device.

Accordingly, the radio frequency measuring device module is configured to be inserted into a radio frequency measuring device. Particularly, the radio frequency measuring device comprises a housing having at least one slot for accommodating the radio frequency measuring device module.

Therefore, the radio frequency measuring device module is configured to be inserted into a slot of the radio frequency measuring device.

According to an aspect, the first sub-module and the second sub-module together form a first module level, at least the third sub-module forming a second module level, the first and the second module levels are positioned on each other. Accordingly, a compact design of the radio frequency measuring device module is ensured. The different module levels each define a certain (horizontal) plane such that the sub-modules are assigned to two different (horizontal) planes being parallel to each other. Due to the two module levels, the radio frequency measuring device module has a double layer structure.

According to another aspect, the first module level and the second module level are positioned on each other in a vertical direction. The module levels, in particular the respective sub-modules, are assigned to a horizontal plane wherein both horizontal planes are positioned on each other forming a double-layer radio frequency measuring device module, seen in a vertical direction.

In fact, the (double-layer) radio frequency measuring device module has two opposite sides each facing outwardly wherein the sides facing outwardly correspond to sides facing away from each other.

According to an embodiment, cooling fins are formed at sides of the first and the second module levels facing away from each other. The cooling fins increase the cooling efficiency of the respective sub-modules as the surface is increased appropriately. The complete outer surface of the radio frequency measuring device module can be used for cooling the sub-modules.

In some embodiments, at least one sub-module has cooling fins at a side facing outwardly. The side facing outwardly corresponds to a side of a certain module level that does not face another module level. The side facing inwardly of a sub-module faces another sub-module, in particular the sub-module of another module layer.

A module level may comprise at least two different sub-modules, the respective cooling fins of the sub-modules merge into each other in order to provide a continuous cooling area at the outer side that comprises cooling fins provided by both neighbored sub-modules. Thus, effective cooling of the sub-modules sharing a common outer side is ensured.

Further, at least one of the first sub-module and the second sub-module may be stacked on the third sub-module. Thus, the sub-modules may be mounted on each other in an interchangeable manner by being stacked into each other. The stacking ensures that the sub-modules, establishing the modular structure of the radio frequency measuring device module, can be connected with and disconnected from each other easily such that they can be replaced without impairing the other sub-modules.

The stacking may correspond to a plug-in connection such that the several sub-modules can be inserted into each other and releasably fixed with each other.

The stacking may be established via connecting members that are formed appropriately.

Moreover, each sub-module may comprise an inter sub-module interface for interconnecting with at least one other sub-module. The inter sub-module interface ensures that the signals processed can be exchanged with the other sub-module(s) appropriately.

The respective inter sub-module interfaces may be established by the connecting members or being at least assigned thereto such that the interfaces are interconnected with each other when the respective sub-modules are stacked onto each other.

The connecting members may be standardized such that the replaceability of each sub-module is ensured.

For instance, the first sub-module has a first inter sub-module interface to be connected with the third sub-module. Thus, the sub-modules being assigned to different module layers can be connected with each other via their respective inter sub-module interfaces in order to establish the desired functionality.

In a similar manner, the second sub-module may have a second inter sub-module interface to be connected with the third sub-module. Thus, the second sub-module also assigned to the first module level is also connected to the third sub-module being assigned to the second module level.

Moreover, the third sub-module may have at least one third inter sub-module interface to be connected with at least one of the first sub-module and the second sub-module. The third inter sub-module interface may be connected to at least one of the first and the second one. Alternatively, the third inter sub-module interface may be configured to be connected with both the first inter sub-module interface and the second inter sub-module interface.

Another aspect provides that at least one sub-module comprises at least two aligning members interacting with at least one other sub-module for aligning the sub-modules with respect to each other. The alignment members may be provided by pins that protrude from a face side of the respective sub-module wherein that face side faces a face side of another sub-module, in particular a sub-module of another module level. The alignment members generally ensure that the sub-modules are positioned on each other in the desired manner.

In general, each sub-module comprises an inner side, also called face side, that faces another sub-module as well as an outer side facing to the outside. In fact, the inner sides of two sub-modules may face each other wherein the outer sides facing away from each other.

According to an aspect, the first sub-module is a digital sub-module having at least one of a digital signal processing unit, a transmitter, a receiver, a field programmable gate array, a random access memory, and a digital measuring device interface. Thus, the digital sub-module may have different functional units used by the radio frequency measuring device module for processing and/or analyzing the radio frequency signal.

Another aspect provides that the second sub-module is a radio frontend sub-module comprising at least one of a radio frequency interface to be connected to the device under test, a multiplexer, an amplifier, a switching unit, and a signal routing. The second sub-module provides the interface for the customer that may connect the device under test to the radio frequency measurement device module via the radio frequency interface appropriately.

According to another aspect, the third sub-module is a base-band sub-module comprising at least an analog digital converter unit. The base-band sub-module converts and digitizes the (pre-) processed signal in a desired manner.

The radio frequency signal received by the radio frequency interface of the second sub-module is (pre-) processed by the second sub-module, in particular the respective components, and then forwarded to the third sub-module, namely the base-band sub-module, for further processing, in particular for being converted in a desired manner. The respective signal processed, in particular the signal converted, is then forwarded to the first sub-module, namely the digital one, for analyzing purposes.

Generally, the first to third sub-modules interact with each other for routing as well as processing the radio frequency signal received appropriately.

According to another aspect, each sub-module has a module housing with predetermined sizes ensuring the interchangeability of each sub-module. The module housing encompasses the functional units of the respective sub-module. As the module housing has predetermined sizes, each of the sub-modules can be exchanged and replaced easily as the respective sub-modules have the same sizes. Moreover, it is ensured that the radio frequency measuring device module may have a predetermined size that corresponds to the slot of the radio frequency measurement device in which the radio frequency measuring device module is inserted.

An aspect provides that the module housing has different wall thicknesses, the thickness of a wall facing inwardly being smaller than the thickness of a wall facing outwardly. In the mounted state, the module housing of each sub-module faces another module housing via its wall facing inwardly. Hence, two neighbored walls of different sub-modules, in particular sub-modules assigned to different module levels, adjoin each other. Accordingly, the thickness of the respective walls facing inwardly can be smaller, for instance being the half, while still ensuring the required mechanical stiffness as they contact another wall facing inwardly. Thus, the respective inner walls are doubled due to the inner walls of adjacent sub-modules assigned to both module levels.

Another aspect provides that the radio frequency measuring device module comprises a frame housing that is configured to accommodate the sub-modules. Thus, the sub-modules, in particular their module housings, are positioned within the frame of the radio frequency measuring device module that will be inserted into a slot of the radio frequency measuring device. For instance, the respective sub-modules are attached to the frame in a releasable manner such that they can be disengaged from the frame housing.

According to an embodiment, at least one of the sub-modules comprises a pad formed on a side of the sub-module facing outwardly, the pad providing an interface for at least one of measurement and calibration. As the pad is positioned at the side of the sub-module facing outwardly, it is ensured that a customer can operate the respective pad in the mounted state of the respective sub-module as the side facing outwardly is accessible for the customer. The pad ensures operation of internal circuits being integrated in the sub-module which cannot be accessed by the operator, in particular in the mounted state of the respective sub-modules.

In general, the radio frequency measuring device module is pre-calibrated. In some embodiments, the respective sub-modules are pre-calibrated.

For instance, the pad providing the interface for calibration can be actuated for a self-calibration of the respective sub-module or rather the radio frequency measuring device module after a new sub-module has been incorporated.

According to another embodiment, a fourth sub-module is provided. Hence, the radio frequency measuring device module comprises four sub-modules in total. The fourth sub-module may comprise further functional units or certain functional units of one of the first to third sub-module. In general, the replaceability of the radio frequency measuring device module is increased appropriately as smaller units can be interchanged and replaced appropriately.

For instance, the fourth sub-module is part of the second module level. Hence, the first module level as well as the second module level each comprise two different sub-modules.

In some embodiments, the first and the second sub-modules adjoin each other in a different plane in vertical direction compared to the third and the fourth sub-modules. Accordingly, the several sub-modules of the radio frequency measuring device module are positioned like a brick wall providing a higher mechanical stability.

Further, embodiments of the present disclosure provide a radio frequency measuring device comprising a housing with at least one slot and at least one radio frequency measuring device module as mentioned above, the radio frequency measuring device module being inserted into the slot. Moreover, the radio frequency measuring device may comprise several slots in which several different radio frequency measuring device modules can be inserted appropriately. In addition, the housing may comprise a common power supply unit for powering the different radio frequency measuring device modules inserted into the respective slots.

Thus, a modular radio frequency measuring device is provided which comprises at least one radio frequency measuring device module which also has a modular structure ensuring a higher replaceability of the respective functional units used by the radio frequency measuring device for routing, processing and analyzing at least one signal of a device under test to be tested by the radio frequency measuring device.

According to an aspect, two radio frequency measuring device modules are provided, the radio frequency measuring device modules being adjacent to each other and facing each other via cooling fins. The heat exchange between the radio frequency measuring device modules is improved as an air stream interacts with both radio frequency measuring device modules simultaneously. Effective cooling can be ensured.

The cooling fins may contact each other. The cooling efficiency is increased appropriately.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

DETAILED DESCRIPTION

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

Figure 1:
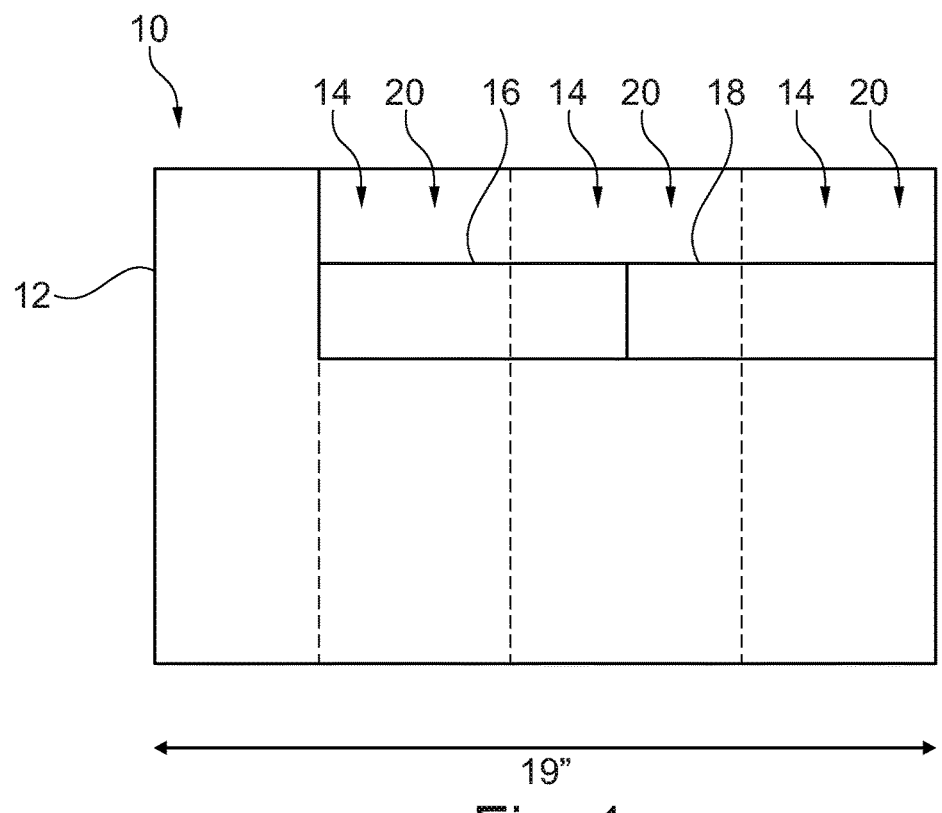
FIG. 1 schematically shows a radio frequency measurement device according to an embodiment of the present disclosure.

In FIG. 1, a radio frequency measuring device 10 is schematically shown from the backside. As shown, the radio frequency measuring device 10 comprises a housing 12 for accommodating functional units to be used for routing, processing and analyzing a radio frequency signal of a device under test to be connected to the radio frequency measuring device 10. The housing 12 has standardized dimensions, in particular a width of about 19" as indicated in FIG. 1.

In the shown embodiment, the housing 12 comprises three different slots 14 that are positioned next to each other in the housing 12. However, the housing 12 may also comprise more than the three different slots 14. The slots 14 are assigned to the front side of the housing 12 such that the slots 14 can be equipped from the front side appropriately.

In addition, a power supply unit 16 as well as a central processing unit 18 are provided that are located within the housing 12. Particularly, the power supply unit 16 and the central processing unit 18 are assigned to the backside of the housing 12.

Further, a motherboard (not shown for purposes of simplicity) is assigned to the power supply unit 16 as well as the central processing unit 18. The motherboard may comprise at least one central interface that is assigned to the slots 14 as will be described later.

In each of the slots 14, a radio frequency measuring device module 20 is inserted that provides at least some of the functional units required by the radio frequency measuring device 10. The radio frequency measuring device modules 20 are inserted in the respective slots 14 such that they interact with the motherboard, in particular the at least one central interface. In fact, the radio frequency measuring device modules 20 are connected (indirectly) with the power supply unit 16 and the central processing unit 18 via the motherboard.

The different functionalities of the radio frequency measuring device modules 20 can be combined appropriately within the radio frequency measuring device 10.

Figure 2:
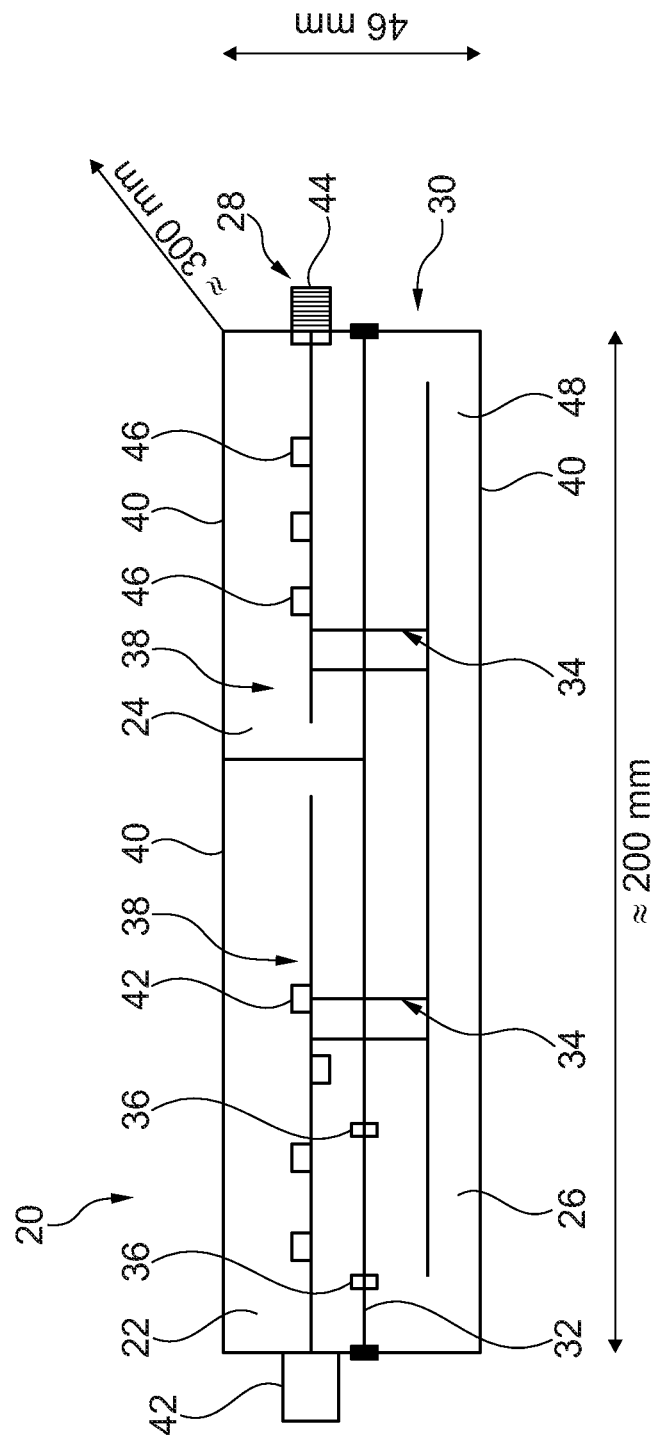
FIG. 2 shows a schematic cross-section through a radio frequency measuring device module according to an embodiment of the present disclosure in vertical direction.

In FIG. 2, one of the radio frequency measuring device modules 20 is shown in a cross-sectional view along a vertical direction. As shown, the radio frequency measuring device module 20 comprises a first sub-module 22, a second sub-module 24 as well as a third sub-module 26. The different sub-modules 22 to 26 are mounted on each other as shown in FIG. 2.

In the shown embodiment, the first sub-module 22 as well as a second sub-module 24 together form a first module level 28 whereas the third sub-module 26 forms a second module level 30. Hence, the first sub-module 22 as well as the second sub-module 24 are positioned on the third sub-module 26 wherein the sub-modules 22 to 26 are interchangeably mounted on each other.

The radio frequency measuring device module 20 comprises a frame housing 32 wherein the sub-modules 22 to 26 are mounted on the frame housing 32 in a releasable manner such that the sub-modules 22 to 26 are accommodated within the frame housing 32. In addition thereto, the sub-modules 22 to 26 are interchangeably mounted on each other.

Hence, the radio frequency measuring device module 20 has a mounted state in which the different sub-modules 22 to 26 are attached to the frame housing 32 having openings as well as to each other.

The sub-modules 22 to 26 each comprise connecting members 34 for interconnecting the sub-modules 22 to 26 with each other. Hence, the sub-modules 22 to 26 are attached to each other in a mechanical manner. However, the connecting members 34 can be disengaged for dismounting at least one of the several sub-modules 22 to 26 for interchanging the respective sub-module 22 to 26.

The respective connecting members 34 may be formed such that the first sub-module as well as the second sub-module 24 are stacked on the third sub-module 26 in order to establish the different module levels 28, 30 wherein the frame housing 32 is sandwiched between the different module levels 28, 30.

Accordingly, the radio frequency measuring device module 20 has a modular structure as the respective sub-modules 22 to 26 can be disengaged and exchanged in a separate manner.

In addition to the connecting members 34, the sub-modules 22 to 26 may also comprise alignment members 36 interacting with holes or other alignment members of the other sub-modules 22 to 26. In general, it is ensured that the sub-modules 22 to 26 stacked on each other are aligned appropriately due to the alignment members 36 when being stacked on each other. This ensures that the sub-modules 22 to 26 are aligned with respect to each other.

Moreover, each of the sub-modules 22 to 26 comprises an inter sub-module interface 38 for interconnecting with at least one of the other sub-modules 22 to 26 wherein the respective inter sub-module interfaces 38 ensure a signal connection between the respective sub-modules 22 to 26.

In the shown embodiment, the first sub-module 22 as well as the third sub-module 26 each comprise an inter sub-module interface 38, namely a first and a third inter sub-module interface, via which the first and the third sub-modules 22, 26 are interconnected with each other such that signals may be exchanged between the respective sub-modules 22, 26.

In a similar manner, the second sub-module and the third sub-module 24, 26 are interconnected with each other via respective inter sub-module interface 38, namely a second and third inter sub-module interface, that also ensure that the signals may be exchanged between both sub-modules 24, 26.

Accordingly, signals may be routed and processed by the several sub-modules 22 to 26 appropriately due to the different inter sub-module interface 38.

In general, each of the sub-modules 22 to 26 has their own module housing 40 with predetermined sizes ensuring the interchangeability of the respective sub-module 22 to 26. Further, the predetermined sizes of the module housings 40 ensure that the radio frequency measurement device module 20 has a predetermined size. The overall dimensions of the radio frequency measurement device module 20 corresponds to a width of 200 millimeters, a depth of 300 millimeters and a height of 46 millimeters as indicated in FIG. 2 wherein the modular stacked sub-modules 22 to 26 are formed plate-like.

Thus, the respective sub-modules 22 to 26 defining a double layer radio frequency measurement device module 20 may have a height of about 23 millimeters since the total height of the radio frequency measurement device module 20 is about 46 millimeters. The length and width of the respective sub-modules 22 to 26 may vary depending on the respective sub-module 22 to 26.

The module housing 34 of the different sub-modules 22 to 26 has different wall thicknesses since the thickness of the wall facing inwardly, namely facing towards another sub-module 22 to 26, is smaller than the signals of a wall facing outwardly. As shown in FIG. 2, the inner walls of each sub-module 22 to 26, namely the walls facing inwardly, substantially adjoin a wall of another sub-module 22 to 26 facing inwardly such that they may contact each other for increasing the overall mechanical stability.

The outer side, namely the side facing outwardly, of a sub-module 22 to 26 corresponds to a side facing outwardly of the whole radio frequency measuring device module 20 as become obvious in FIG. 2.

As shown in FIG. 2, the respective sub-modules 22 to 26 correspond to different functional units. For instance, the first sub-module 22 corresponds to a digital sub-module having a first functional unit 42 such as a digital signal processing unit, a transmitter, a receiver, a field programmable gate array (FPGA), a random access memory (RAM) and/or a digital measurement device interface for being connected with the motherboard of the radio frequency measuring device 10.

The second sub-module 24 corresponds to a radio frontend sub-module comprising at least one of a radio frequency interface 44 to be connected to the device under test for testing purposes and second functional units 46 such as a multiplexer, an amplifier, a switching unit, and/or a signal routing.

Further, the third sub-module 26 corresponds to a baseband sub-module comprising at least an analog digital converter unit 48.

As the several sub-modules 22 to 26 are interconnected with each other via the inter sub-module interfaces 38, the radio frequency signal received via the radio frequency interface 44 of the second sub-module 24 is processed by the several sub-modules 22 to 26 appropriately, in particular the functional units.

Figure 3:
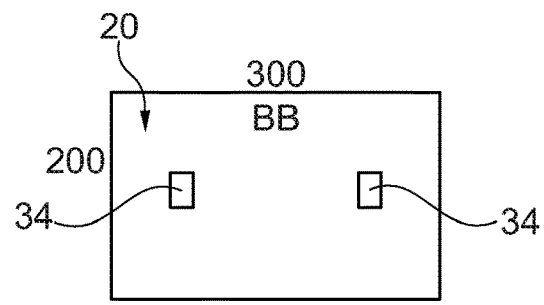
FIG. 3 shows a top view on the bottom of a radio frequency measuring device module according to an embodiment of the present disclosure
Figure 4:
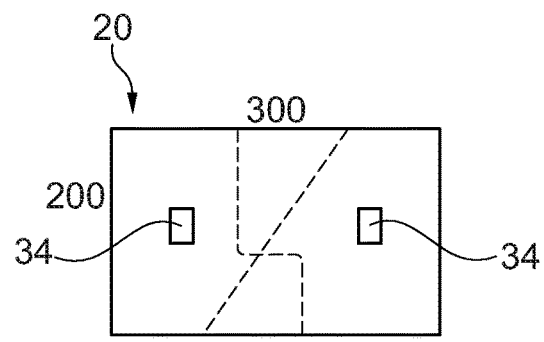
FIG. 4 shows a top view on the top of a radio frequency measuring device module according to an embodiment of the present disclosure.

In FIGS. 3 and 4, top views on a radio frequency measurement device module 20 from the bottom (FIG. 3) and the bottom (FIG. 4) are shown. Particularly, the dashed lines in FIG. 4 illustrate that the first and second sub-modules 22, 24 may be located in a different member, in particular having different shapes.

Figure 5:
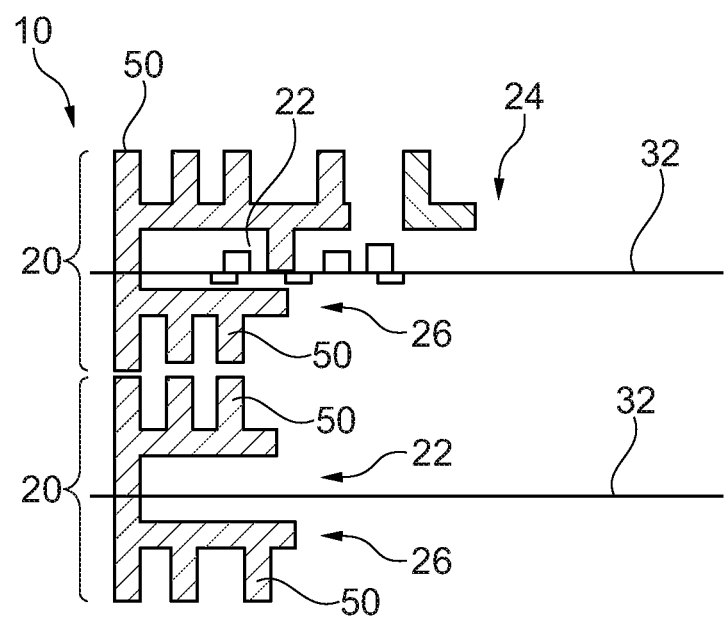
FIG. 5 shows a schematic cross-section through a detail of a radio frequency measuring device according to an embodiment of the present disclosure.

As shown in both FIGURES, the respective sub-modules 22 to 26 can be detached appropriately as the connecting members 34 are accessible from the outside easily. In FIG. 5, a cross-section through a detail of the radio frequency measuring device 10 in vertical direction is shown, in particular a cross-section through two neighbored radio frequency measuring device modules 20.

It becomes obvious that each radio frequency measuring device module 20 has cooling fins 50 at its sides facing outwardly.

Hence, the respective sub-modules 22 to 26 have cooling fins 50 at one side that is opposite to the one facing towards the frame housing 32 or inwardly. In fact, the first and the second module levels 28, 30 have cooling fins 50 at sides facing away from each other defining the outer sides of the respective radio frequency measuring device module 20.

Since the side facing outwardly of at least one module level 28, 30 is established by at least two sub-modules 22 to 26, the respective cooling fins 50 assigned to neighbored sub-modules 22 to 26 may merge into each other in order to ensure a continuous cooling area that comprises the cooling fins 50.

As shown in FIG. 5, adjacent radio frequency measuring device modules 20 face each other via their respective cooling fins 50 ensuring a good cooling of the functional units provided by the sub-modules 22 to 26. The cooling fins 50 of the adjacent radio frequency measuring device modules 20 may contact each other.

Figure 6:
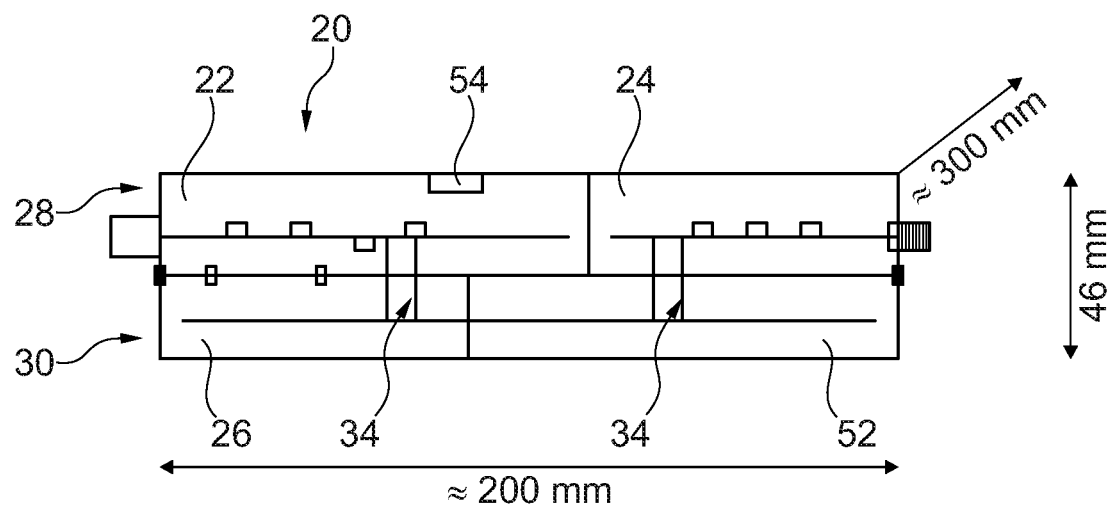
FIG. 6 shows a schematic cross-section through a radio frequency measuring device module according to another embodiment of the present disclosure in vertical direction.

In FIG. 6, another embodiment of a radio frequency measuring device module 20 is shown that comprises four sub-modules 22 to 26, 52. The fourth sub-module 52 is located next to the third sub-module 26. Accordingly, the third and the fourth sub-modules 26, 52 are assigned to the second module level 30 whereas the first and the second sub-modules 22, 24 are assigned to the first module level 28.

The first sub-module 22 and the second sub-module 24 adjoin each other in a vertical plane being different to the vertical plane in which the third sub-module 26 and the fourth sub-module 52 adjoin each other. Hence, the radio frequency measuring device module 20 comprising four sub-modules 22 to 26, 52 is established in a brick wall like manner increasing the mechanical stability of the whole radio frequency measuring device module 20.

Generally, at least one of the sub-modules 22 to 26, 52 comprises a pad 54 formed on a side of the respective sub-module 22 to 26, 52 facing outwardly. In the shown embodiment of FIG. 6, the first sub-module 22 comprises the pad 54 that provides an interface for at least one of measurement and calibration.

The customer of the radio frequency measurement device 10, in particular the radio frequency measurement device module 20, may activate the respective pad 54 as it is accessible from the outside in the mounted state. The pad 54 is connected to internal circuits of the respective sub-module 22 such that a signal can be transmitted between the pad 54 and the internal circuits.

Generally, the radio frequency measuring device module 20 having a modular structure ensures that the several functional units established by the sub-modules can be exchanged easily as they are interchangeably mounted on each other.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The invention claimed is:

1. A radio frequency measuring device module, comprising:
   a first sub-module, said first sub-module being a digital sub-module comprising one or more components selected from a group consisting of a digital signal processing unit, a transmitter, a receiver, a field programmable gate array, a random access memory, and a digital measuring device interface;
   a second sub-module, said second sub-module being a radio frontend sub-module comprising one or more components selected from the group consisting of a radio frequency interface to be connected to a device under test, a multiplexer, an amplifier, a switching unit, and a signal routing; and
   a third sub-module, said third sub-module being a baseband sub-module comprising at least an analog digital converter unit;
   wherein said first, second and third sub-modules each comprise connecting members for interconnecting said first, second and third sub-modules with each other in a mechanical manner; and
   wherein said radio frequency measuring device module has a modular structure for ensuring said first, second and third sub-modules being interchangeably mounted on each other in a mechanical manner.

2. The radio frequency measuring device module according to claim 1, wherein said first sub-module and said second sub-module together form a first module level, at least said third sub-module forming a second module level, said first and said second module levels are positioned on each other.

3. The radio frequency measuring device module according to claim 1, wherein cooling fins are formed at sides of said first and said second module levels facing away from each other.

4. The radio frequency measuring device module according to claim 1, wherein at least one sub-module has cooling fins at a side facing outwardly.

5. The radio frequency measuring device module according to claim 1, wherein at least one of said first sub-module and said second sub-module is stacked on said third sub-module.

6. The radio frequency measuring device module according to claim 1, wherein each sub-module comprises an inter sub-module interface for interconnecting with at least one other sub-module.

7. The radio frequency measuring device module according to claim 1, wherein at last one sub-module comprises at least two alignment members interacting with at least one other sub-module for aligning said sub-modules with respect to each other.

8. The radio frequency measuring device module according to claim 1, wherein each sub-module has a module housing with predetermined sizes ensuring the interchangeability of each sub-module.

9. The radio frequency measuring device module according to claim 8, wherein said module housing has different wall thicknesses, the thickness of a wall facing inwardly being smaller than the thickness of a wall facing outward.

10. The radio frequency measuring device module according to claim 1, wherein said radio frequency measuring device module comprises a frame housing that is configured to accommodate said sub-modules.

11. The radio frequency measuring device module according to claim 1, wherein a fourth sub-module is provided.

12. The radio frequency measuring device module according to claim 11, wherein said fourth sub-module is part of said second module level.

13. The radio frequency measuring device module according to claim 11, wherein said first and said second sub-modules adjoin each other in a different plane in vertical direction compared to said third and said fourth sub-modules.

14. A radio frequency measuring device comprising a housing with at least one slot and a radio frequency measuring device module according to claim 1, said radio frequency measuring device module being inserted into said slot.

15. The radio frequency measuring device according to claim 14, wherein two radio frequency measuring device modules are provided, said radio frequency measuring device modules being adjacent to each other and facing each other via cooling fins.

16. The radio frequency measuring device according to claim 15, wherein said cooling fins contact each other.

17. A radio frequency measuring device module, comprising:
   a first sub-module, said first sub-module being a digital sub-module comprising one or more components selected from a group consisting of a digital signal processing unit, a transmitter, a receiver, a field programmable gate array, a random access memory, and a digital measuring device interface;
   a second sub-module, said second sub-module being a radio frontend sub-module comprising one or more components selected from a group consisting of a radio frequency interface to be connected to a device under test, a multiplexer, an amplifier, a switching unit, and/or a signal routing; and
   a third sub-module, said third sub-module being a baseband sub-module comprising at least an analog digital converter unit;
   wherein said radio frequency measuring device module has a modular structure for ensuring said first, second and third sub-modules being interchangeably mounted on each other; and
   wherein at least one of said sub-modules comprises a pad formed on a side of said sub-module facing outwardly, said pad providing an interface for at least one of measurement and calibration.

* * * * *